United States Patent
Kang et al.

(10) Patent No.: US 11,599,024 B2
(45) Date of Patent: Mar. 7, 2023

(54) PHOTOPOLYMERIZABLE RESIN COMPOSITION, DISPLAY DEVICE USING SAME, AND MANUFACTURING METHOD THEREOF

(71) Applicant: Samsung Display Co., LTD., Yongin-si (KR)

(72) Inventors: Hoon Kang, Yongin-si (KR); Yong-Hoon Yang, Hwaseong-si (KR); Yang-Ho Jung, Seoul (KR); Seon Hwa Choi, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 16 days.

(21) Appl. No.: 16/742,342

(22) Filed: Jan. 14, 2020

(65) Prior Publication Data

US 2020/0272052 A1     Aug. 27, 2020

(30) Foreign Application Priority Data

Feb. 21, 2019     (KR) .................. 10-2019-0020762

(51) Int. Cl.
| | |
|---|---|
| *G03F 7/11* | (2006.01) |
| *G02F 1/1368* | (2006.01) |
| *G02F 1/1339* | (2006.01) |
| *G02F 1/1362* | (2006.01) |
| *H01L 27/32* | (2006.01) |
| *G03F 7/095* | (2006.01) |

(Continued)

(52) U.S. Cl.
CPC .............. *G03F 7/11* (2013.01); *G02F 1/1368* (2013.01); *G02F 1/13394* (2013.01); *G02F 1/136227* (2013.01); *G03F 1/32* (2013.01); *G03F 7/095* (2013.01); *H01L 27/3248* (2013.01); *H01L 51/525* (2013.01); *G02F 1/13398* (2021.01); *H01L 27/1288* (2013.01); *H01L 51/56* (2013.01); *H01L 2227/323* (2013.01)

(58) Field of Classification Search
CPC . G03F 7/11; G03F 7/0752; G03F 1/32; G03F 7/095; G02F 1/136209; G02F 1/1368; G02F 1/136227; G02F 1/13394; G02F 1/13398; H01L 27/3248; H01L 51/0018; H01L 51/525; H01L 2227/323; H01L 51/56; H01L 27/1288; H01L 27/3246
See application file for complete search history.

(56) References Cited

U.S. PATENT DOCUMENTS

| | | | |
|---|---|---|---|
| 5,316,616 A * | 5/1994 | Nakamura | ........ H01L 21/28114 257/E21.205 |
| 2001/0009295 A1* | 7/2001 | Furusawa | ........... H01L 23/5222 257/635 |

(Continued)

FOREIGN PATENT DOCUMENTS

| | | | |
|---|---|---|---|
| JP | 2003103688 A | * | 4/2003 |
| JP | 2006-154122 | | 6/2006 |

(Continued)

*Primary Examiner* — Hoan C Nguyen
(74) *Attorney, Agent, or Firm* — Kile Park Reed & Houtteman PLLC

(57) ABSTRACT

A photopolymerizable resin composition includes a first layer and a second layer; and a barrier layer disposed between the first layer and the second layer, the barrier layer includes one or more of SiNx, SiOx, SiON, Mo, a Mo oxide, Cu, a Cu oxide, Al, an Al oxide, Ag, and a Ag oxide.

31 Claims, 14 Drawing Sheets

(51) Int. Cl.
G03F 1/32 (2012.01)
H01L 51/52 (2006.01)
H01L 27/12 (2006.01)
H01L 51/56 (2006.01)

(56) References Cited

U.S. PATENT DOCUMENTS

| | | | | |
|---|---|---|---|---|
| 2001/0046780 A1* | 11/2001 | Nakagawa | ........ | H01L 21/31144 |
| | | | | 438/712 |
| 2006/0027804 A1* | 2/2006 | Yamazaki | ............ | G02F 1/1368 |
| | | | | 257/59 |
| 2006/0113894 A1* | 6/2006 | Fujii | .................. | H01L 27/1292 |
| | | | | 313/499 |
| 2006/0205102 A1* | 9/2006 | French | ............. | G02F 1/136209 |
| | | | | 438/30 |
| 2007/0058099 A1* | 3/2007 | Eguchi | ............. | G02F 1/136227 |
| | | | | 349/43 |
| 2008/0032437 A1* | 2/2008 | Sugimoto | ................ | G03F 1/70 |
| | | | | 438/57 |
| 2009/0289030 A1* | 11/2009 | Ueno | .................. | H05K 3/0035 |
| | | | | 216/17 |
| 2012/0326313 A1* | 12/2012 | Uzoh | ................ | H01L 21/76897 |
| | | | | 257/751 |
| 2014/0131713 A1* | 5/2014 | Lee | ....................... | H01L 27/124 |
| | | | | 257/59 |
| 2017/0104178 A1* | 4/2017 | Okada | ................. | H01L 51/5253 |
| 2019/0326553 A1* | 10/2019 | Abe | .......................... | G09F 9/00 |
| 2019/0333425 A1* | 10/2019 | Yasuda | ............... | H01L 27/1218 |

FOREIGN PATENT DOCUMENTS

| | | |
|---|---|---|
| JP | 2012-015343 | 1/2012 |
| JP | 2016211060 A * | 12/2016 |
| KR | 10-1990-0002688 | 3/1988 |
| KR | 10-2005-0055705 | 6/2005 |
| KR | 10-2009-0041070 | 4/2009 |
| KR | 10-2011-0016730 | 2/2011 |

* cited by examiner

PHOTOPOLYMERIZABLE RESIN COMPOSITION, DISPLAY DEVICE USING SAME, AND MANUFACTURING METHOD THEREOF

CROSS-REFERENCE TO RELATED APPLICATION

This application claims priority to and the benefits of Korean Patent Application No. 10-2019-0020762 under 35 U.S.C. § 119 filed in the Korean Intellectual Property Office on Feb. 21, 2019, the entire contents of which are incorporated herein by reference.

BACKGROUND

(a) Technical Field

The present disclosure relates to a photopolymerizable resin composition, a display device using the same, and a method for manufacturing the display device, and more particularly, it relates to a photopolymerizable resin composition having a multilayered structure and including a barrier layer.

(b) Description of the Related Art

A photopolymerizable resin composition may be uniformly coated or applied on an insulation layer or a conductive metal layer on a substrate to form patterns that form a display device.

In general, the photopolymerizable resin composition is coated and then dried. The coated photopolymerizable resin composition is exposed and developed under a predetermined-shaped mask such that a desired pattern may be formed. A metal layer or an insulation layer is etched by using a mask, and residual photopolymerizable resin composition film is removed such that a desired pattern may be formed on the substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Exemplary embodiments have been made in an effort to provide a photopolymerizable resin composition having an improved patterning characteristic, a display device using the same, and a method for manufacturing the display device.

A photopolymerizable resin composition according to an exemplary embodiment of the invention includes: a first layer and a second layer; and a barrier layer disposed between the first layer and the second layer, wherein the barrier layer includes one or more of SiNx, SiOx, SiON, Mo, a Mo oxide, Cu, a Cu oxide, Al, an Al oxide, Ag, and a Ag oxide.

'x' may denote 1 to 4.

The first layer and the second layer may include the same material.

The first layer and the second layer may have different etching rates.

The first layer and the second layer may include different materials.

The first layer and the second layer may have different etching rates.

The barrier layer may have a thickness in a range of about 20 Å to about 1000 Å.

An etching rate of the barrier layer may be between an etching rate of the first layer and an etching rate of the second layer.

An etching rate of the first layer may be greater than that of the barrier layer, and an etching rate of the barrier layer may be greater than that of the second layer.

An etching rate of the second layer may be greater than that of the barrier layer, and the etching rate of the barrier layer may be greater than that of the first layer.

According to another exemplary embodiment of the invention, a method for manufacturing a photopolymerizable resin composition is provided. The method includes: applying a first layer of a photoresist; forming a barrier layer on the first layer; applying a second layer on the barrier layer; exposing the photoresist by using a mask; and simultaneously etching the first layer and the second layer of the exposed photoresist, the first layer, the barrier layer, and the second layer may have different etching rates.

An etching rate of the first layer may be greater than that of the barrier layer, and the etching rate of the barrier layer is greater than that of the second layer.

The forming of the barrier layer may comprise forming the barrier layer of one or more of SiNx, SiOx, SiON, Mo, a Mo oxide, Cu, a Cu oxide, Al, an Al oxide, Ag, and a Ag oxide.

The first layer and the second layer may include the same material.

The first layer and the second layer may include the same material and have different etching rates.

The first layer and the second layer may include different materials.

The barrier layer may have a thickness in a range of about 20 Å to about 1000 Å.

The etching rate of the barrier layer may be between the etching rate of the first layer and the etching rate of the second layer.

An etching rate of the second layer may be greater than that of the barrier layer, and the etching rate of the barrier layer may be greater than that of the first layer.

In a photoresist pattern formed in simultaneous etching of the first layer and the second layer of the exposed photoresist, an area of the first layer may be greater than that of the second layer of a formed photoresist pattern.

The etching rate of the first layer may be greater than that of the barrier layer, and the etching rate of the barrier layer may be greater than that of the second layer.

In a photoresist pattern formed in the simultaneous etching of the first layer and the second layer of the exposed photoresist, the area of the first layer may be smaller than that of the second layer of a formed photoresist pattern.

A size of the area of the barrier layer may be between an area of the first layer and an area of the second layer.

The etching rates of the first layer, the barrier layer, and the second layer may determine a shape of the formed photoresist pattern.

The formed photoresist pattern may be used to form a semiconductor layer and source and drain electrodes, an emission layer, or a support that locates a mask.

The mask may be a half-tone mask.

A display device according to an exemplary embodiment of the invention includes: a first substrate; a transistor disposed on the first substrate; a pixel electrode connected with the transistor; and a photoresist disposed on the pixel electrode, wherein the photoresist may include a first layer and a second layer, and a barrier layer disposed between the first layer and the second layer, and an area of the second layer is different than that of the first layer.

The photoresist may be a spacer.

The area of the second layer may be smaller than that of the first layer.

The spacer may be a barrier rib spacer in which a second layer protrudes from a first layer of a barrier rib.

The barrier rib may include an opening disposed over the pixel electrode and an emission layer is disposed in the opening of the barrier rib.

The display device may further include: a second substrate disposed over the first substrate; and a liquid crystal layer disposed between the first substrate and the second substrate, wherein the spacer may be disposed between the first substrate and the second substrate, and the first layer and the second layer of the spacer may include a light blocking material.

The barrier layer may include one or more of SiNx, SiOx, SiON, Mo, a Mo oxide, Cu, a Cu oxide, Al, an Al oxide, Ag, and a Ag oxide, and the barrier layer may have a thickness in a range of about 20 Å to about 1000 Å.

According to exemplary embodiments, a photopolymerizable resin composition of which a patterning characteristic is improved, a display device using the same, and a method for manufacturing a display device may be provided.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
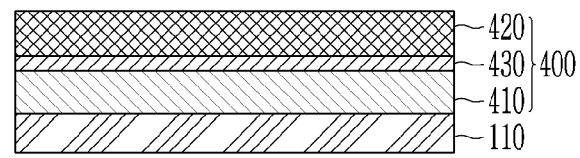
FIG. 1 shows a photoresist according to an exemplary embodiment of the invention.

Embodiments of the invention will be described hereinafter with reference to the accompanying drawings Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

The drawings and descriptions are to be regarded as illustrative in nature and not restrictive. Like reference numerals designate like elements throughout the specification.

In the drawings, size and thickness of elements may be enlarged for clarity and ease of description. However, the invention is not limited thereto. In the drawings, the thickness of layers, films, panels, regions, and other elements, may be exaggerated for clarity.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further, when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Further, in this specification, the phrase "on a plane" means viewing a target portion from the top, and the phrase "on a cross-section" means viewing a cross-section formed by vertically cutting a target portion from the side.

Hereinafter, a photoresist, a method for manufacturing a display device, and a display device according to exemplary embodiments of the invention will be described in detail.

FIG. 1 illustrates a photoresist according to an exemplary embodiment of the invention.

It should be noted that the photoresist may take on various shapes and structures and is not limited to the examples in the specification and as illustrated in the figures. For example, the photoresist may take the shape/structure of a spacer, a barrier rib spacer, a semiconductor element, source and drain electrodes, or a support that may fix a large-sized mask in a mask process for forming an emission layer of an organic light emitting diode display or an emission layer. Referring to FIG. 1, a photoresist 400 according to the exemplary embodiment may include a first layer 410, a second layer 420, and a barrier layer 430 disposed between the first layer 410 and the second layer 420.

The first layer 410 and the second layer 420 may include a same or similar material, or may include different materials. The first layer 410 may be a material suitable for spin coating or slit coating a substrate 110 where the photoresist is coated. The second layer 420 may be formed of a material not easily mixed with the first layer 410.

By way of example, the photo-resist of a double-coated structure of the first layer 410 and the second layer 420 will be described. With the use of a half-tone mask, the number of masks used in the entire process may be reduced by simultaneously etching the first layer 410 and the second layer 420 A difference in etching rates between the first layer 410 and the second layer 420 may be used to create numerous patterns suitable for use in a display device.

However, when the first layer 410 and the second layer 420 have significant differences in their surface characteristics, or other physical properties, in the double-layered photoresist, the second layer 420 may not be sufficiently coated on the first layer 410. When the first layer 410 and the second layer 420 have different properties, each layer may require a different developing agent, and the second layer 420 may be detached when the first layer 410 is developed.

When the second layer 420 and the first layer 410 have similar properties with respect to each other, the second layer 420 and the first layer 410 may interfere with each other at an interface and a boundary may not be clear. Although, one or more patterns may be formed with one mask by using the first layer 410 and the second layer 420, each having different etching characteristics, and when the boundary between the first layer 410 and the second layer 420 is not clear, precision of the patterns may be reduced and adversely affected.

However, the photoresist according to an exemplary embodiment includes the barrier layer 430 disposed between the first layer 410 and the second layer 420. The barrier layer 430 may be transparent, and may be developed by a developing agent.

The barrier layer 430 may include a molybdenum oxide. Molybdenum oxide is transparent, and preferably used as a material of the barrier layer 430 because it may be developed by a developing agent. Other suitable materials for the barrier layer 430 may include one or more of SiNx, SiOx, SiON, Mo, Cu, a Cu oxide, Al, an Al oxide, Ag, and a Ag oxide. Herein, 'x' may denote 1 to 4. The above-stated materials are transparent and can be developed by a developing agent.

The barrier layer 430 may have a thickness in a range of about 20 Å to about 1000 Å. When the thickness of the barrier layer 430 is less than about 20 Å, the barrier layer 430 may not be fully effective, and when the thickness of the barrier layer 430 exceeds about 1000 Å, transparency of the barrier layer 430 may be reduced.

In the photoresist where the barrier layer 430 is disposed between the first layer 410 and the second layer 420, the first layer 410 and the second layer 420 do not interface with each other even when they are formed of the same or similar material. Even when the first layer 410 and the second layer 420 include different materials, when the barrier layer 430 is disposed between the first layer 410 and the second layer 420, a problem that the first layer 410 and the second layer 420 are not coated with each other may be solved.

A barrier layer 430 thus functions as a barrier that slows or alters the etching rate in the etching process of a halftone mask or other suitable mask processes, and enables the photoresist 400 to be formed in an accurate shape or shapes.

The shape of the photoresist 400 may be changed after exposure and developing using a mask based upon etching characteristics of the first layer 410, the second layer 420, and the barrier layer 430.

Figure 2:
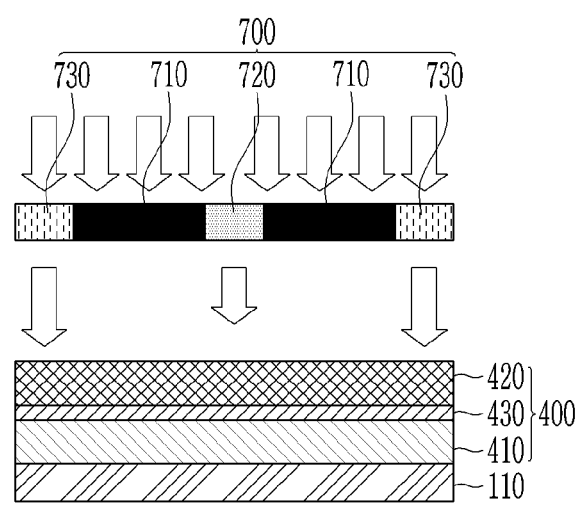
FIG. 2 shows an exposure process using a photoresist mask according to an exemplary embodiment.

FIG. 2 shows a process of exposing the photoresist by application of a mask according to the exemplary embodiment. Referring to FIG. 2, a mask 700 may be a halftone mask that includes light blocking portions 710, at least a halftone portion 720, and exposure portions 730.

The shape of the photoresist 400 may be changed after exposure and developing by using the mask 700 based upon etching characteristics of each layer that forms the photoresist 400.

Figure 3:
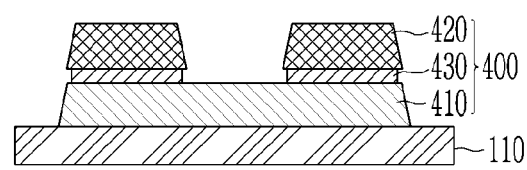
FIG. 3 to FIG. 5 show photoresist patterns according to an exemplary embodiment of the invention.

For example, when the etching rate is greater in an order of the second layer 420, the barrier layer 430, and the first layer 410, the photoresist 400 may be etched as shown in FIG. 3. The second layer 420 and the barrier layer 430 that are well etched are etched and the first layer 410 may remain without being etched. The photoresist etched as shown in the shape of FIG. 3 may be used in a process for forming a source electrode, a drain electrode, and a semiconductor layer in the display device with a single mask.

Figure 4:
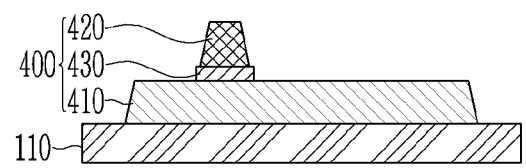

As another example, when the etching rate is greater in an order of the second layer 420, the barrier layer 430, and the first layer 410, the photoresist 400 may be etched in the shape as shown in FIG. 4 depending on a shape or type of mask used. A pattern of the photoresist 400 etched in the shape shown in FIG. 4 may be used in a process for forming a spacer of the display device.

In the photoresists 400 of FIG. 3 and FIG. 4, the first layer 410 and the second layer 420 may be the same or similar material. In a deposition process of the photoresist 400, the first layer 410 may be coated and baked, the barrier layer 430 is formed, and the second layer 420 may be coated and baked. Thus, since the first layer 410 undergoes a baking process two times, the first layer 410 is more cured even through the first layer 410 is the same or similar material as the second layer 420, and accordingly, the etching rate of the first layer 410 is less than that of the second layer 420. Accordingly, even when the same or similar material is used, the first layer 410 and the second layer 420 may have different etching rates.

Figure 5:
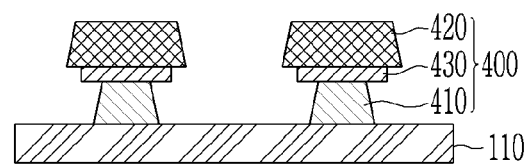

Alternatively, when the etching rate is greater in an order of the first layer 410, the barrier layer 430, and the second layer 420, as shown in FIG. 5, a photoresist pattern of a reversed-taper structure may be formed. It should be noted that the term reverse-taper may include other similar structures and thus the term taper should not be construed as limiting. The pattern shown in FIG. 5 may become, for example, a support that may fix a large-sized mask in a mask process for forming an emission layer of an organic light emitting diode display. Alternatively, the pattern of the photoresist 400 shown in FIG. 5 may be used as a mask for forming an emission layer.

As described, the problem of the first layer 410 and the second layer 420 mixing together or being separated from each other due to not being coated with each other at an interface may be solved since the barrier layer 430 separates the first layer 410 and the second layer 420 in the photoresist 400 having a structure in which the barrier layer 430 is disposed between the first layer 410 and the second layer 420. The barrier layer 430 functions as a barrier in an etching process while having an etching rate between the etching rate of the first layer 410 and the etching rate of the second layer 420, and accordingly, when a mask such as a halftone mask is used, the photoresist 400 may be etched to have a uniform cross-section.

A method for manufacturing a display device according to an exemplary embodiment of the invention will be described. A method for manufacturing a display device according to an exemplary embodiment of the invention may include forming a first layer of a photoresist, forming a barrier layer on the first layer, forming a second layer on the barrier layer, exposing the photoresist by using a mask, and simultaneously etching the first layer and the second layer of the exposed photoresist.

Figure 6:
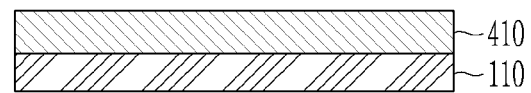
FIG. 6 to FIG. 10 show a manufacturing process of a display device according to an exemplary embodiment.

FIG. 6 to FIG. 10 illustrate a process for manufacturing a display device according to an exemplary embodiment. Referring to FIG. 6, a first layer 410 of the photoresist is formed on a substrate 110. The first layer may be formed, for example, by applying or coating a photoresist material and then baking.

Figure 7:
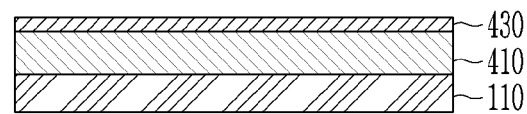

Referring to FIG. 7, a barrier layer 430 is formed on the first layer 410. The barrier layer 430 may include a molybdenum oxide. Other suitable materials for the barrier layer 430 may include one or more of SiNx, SiOx, SiON, Mo, Cu, a Cu oxide, Al, an Al oxide, Ag, and a Ag oxide. Herein, 'x' may denote 1 to 4. The barrier layer 430 may have a thickness in a range of about 20 Å to about 1000 Å.

Figure 8:
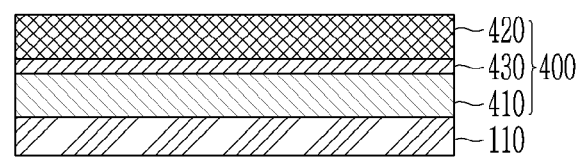

Referring to FIG. 8, the second layer 420 is formed. The second layer 420 may be formed by applying or coating a photoresist material and then baking.

The first layer 410 and the second layer 420 may be the same, or similar material or may be different materials.

Figure 9:
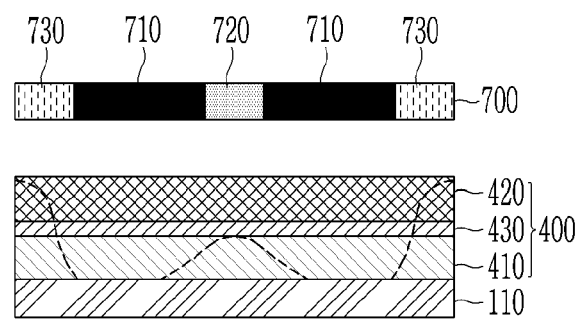

Referring to FIG. 9, the photoresist 400 is exposed to a halftone mask 700. Referring to FIG. 9, the halftone mask 700 may include light blocking portions 710, at least a halftone portion 720, and exposure portions 730. In FIG. 9, dotted lines indicate the amount of light that may be incident through the halftone mask 700. For example, when the dotted line is farther away from the substrate 110, the photoresist is more exposed to light.

Figure 10:
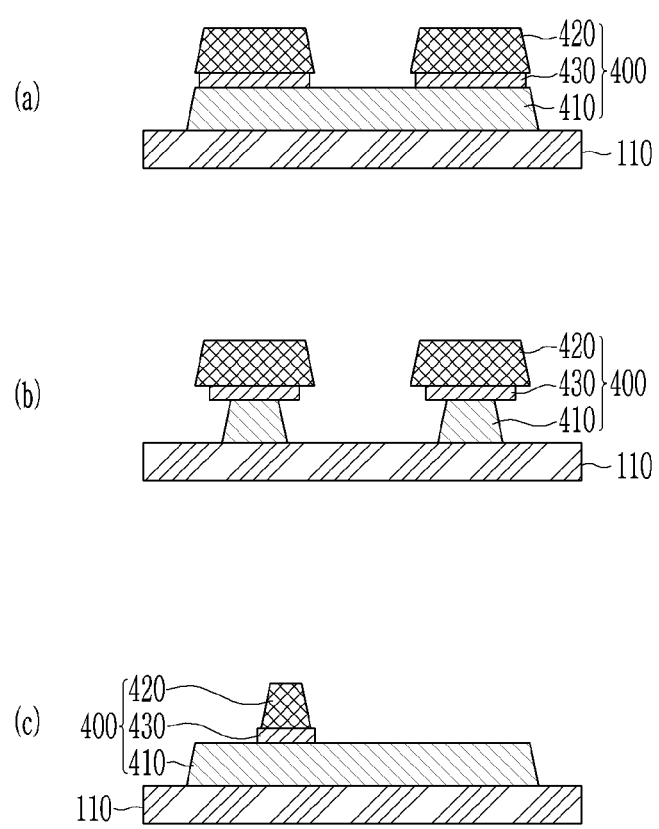

Referring to FIG. 10, the photoresist 400 is etched. The photoresist may be etched to different shapes depending on etching characteristics of the first layer 410, the barrier layer 430, and the second layer 420.

When the etching rate is greater in an order of the second layer 420, the barrier layer 430, and the first layer 410, the photoresist 400 may be etched to the shape illustrated in FIG. 10(a) or FIG. 10(c). When the etching rate is greater in the order of the first layer 410, the barrier layer 430, and the second layer 420, the photoresist 400 may be etched to a shape illustrated in FIG. 10(b).

Such etched patterns may be used in various manufacturing processes of a display device. For example, the pattern shown in FIG. 10(a) may be used in a process for forming a semiconductor layer and source/drain electrodes with one mask in a display device. The source and drain electrodes may be etched with the pattern of FIG. 10(a) and then the pattern FIG. 10(a) may be further etched such that between the exposed first layer 410 and the semiconductor layer is formed using such a pattern.

The pattern like FIG. 10(b) may be used in a process for forming an emission layer of a display device. FIG. 10(b) may have a reverse-taper structure, and an emission layer may be formed by using such a reverse-taper structure, and the pattern of FIG. 10(b) may be removed. As another example, the pattern of FIG. 10(b) may be used as a support to stably locate a mask in a large-sized panel. It should be noted that the term reverse-taper may include other similar structures and thus the term taper should not be construed as limiting.

The pattern like FIG. 10(c) may be used as a spacer of a display device. The pattern FIG. 10(c) may be used as a light blocking spacer of a liquid crystal display or a spacer disposed in a barrier rib of a display device.

Figure 11:
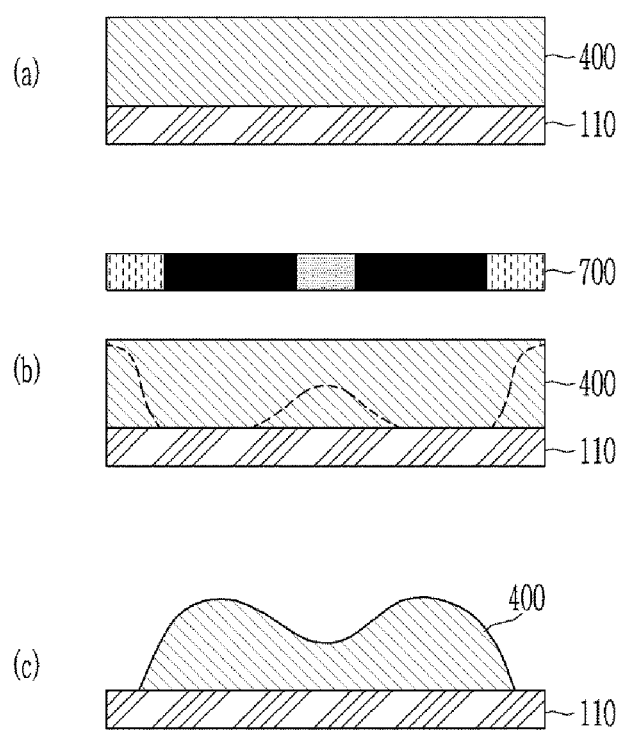
FIG. 11 shows an etching process of a display device according to a comparative example of the invention.

FIG. 11 shows an etching process of a display device according to a comparative example of the invention. Referring to FIG. 11, when a photoresist 400 is a single layer, rather than a flat pattern or multilayer structure, a curved pattern may be formed even though a halftone mask 700 is used in etching. In an exposure process as illustrated in FIG. 11 using the halftone mask 700, some light does not enter perpendicularly to the mask 700 but enters from the side. An area that should not be exposed by light 700 enters from the side and is also exposed, and accordingly, a curved pattern shown in FIG. 11(c) is formed. In FIG. 11(b), dotted lines indicate the amount of light incident through the halftone mask 700. When the dotted line is farther away from the substrate 110, the photoresist is more exposed to light.

Figure 12:
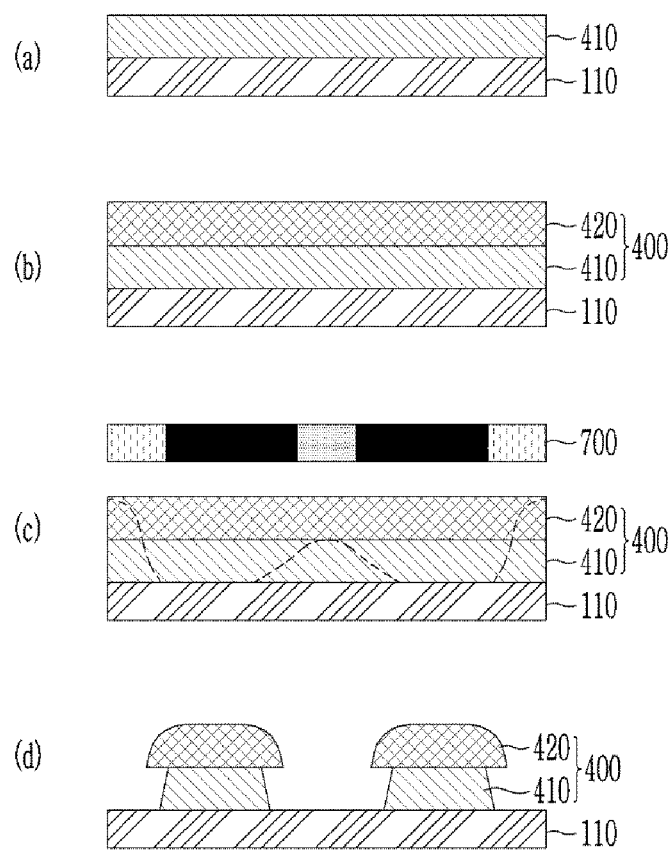
FIG. 12 shows an etching process of a display device according to another comparative example of the invention.

FIG. 12 shows an etching process of a display device according to another comparative example of the invention when the barrier layer is absent. Referring to FIG. 12, an etching process of a display device according to the comparative example includes a first layer 410 and a second layer 420, and does not include a barrier layer. In FIG. 12(c), dotted lines indicate the amount of light incident through a halftone mask 700. As the dotted line is farther away from the substrate 110, a photoresist is more exposed to light.

However, similar to the comparative example of FIG. 11, a final pattern has a curved shape due to light incident from a side. The final pattern having a curved shape is shown in FIG. 12(d).

However, referring back to FIG. 10, the method for manufacturing the display device according to the exemplary embodiment of the invention may form more accurate patterns rather than forming a curved pattern because etching is blocked once by the barrier layer 430 having an etching rate that is between an etching rate of the first layer 410 and an etching rate of the second layer 420. Therefore, the accuracy of resultant shapes of the process may be improved in the process using such a photoresist pattern.

Hereinafter, a display device according to an exemplary embodiment of the invention will be described in detail with reference to the drawings.

Figure 13:
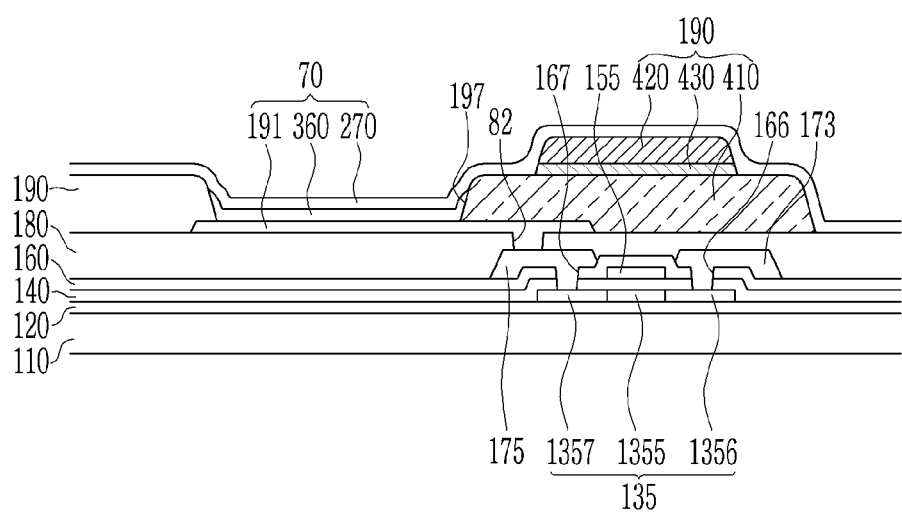
FIG. 13 shows one cross-section of a display device according to an exemplary embodiment of the invention.

FIG. 13 shows one cross-section of a display device according to an exemplary embodiment of the invention. Referring to FIG. 13, a buffer layer 120 may be disposed on a substrate 110. The buffer layer 120 may include a single layer or a multilayer of a silicon nitride (SiNx) and a silicon oxide (SiOx), and may prevent permeation of an impurity or an undesired component such as moisture and other contaminants.

A first semiconductor layer 135 may be disposed on the buffer layer 120. The first semiconductor layer 135 may include a polysilicon or an oxide semiconductor.

The first semiconductor layer 135 may include a first channel region 1355, a first source region 1356, and a first drain region 1357. The first source region 1356 and the first drain region 1357 are respectively disposed at opposite sides of the first channel region 1355. The first channel region 1355 of the first semiconductor layer 135 is a region where an impurity is not doped, and the first source region 1356 and the first drain region 1357 of the first semiconductor layer 135 may be regions doped with a conductive impurity.

A gate insulation layer 140 may be disposed on the first semiconductor layer 135. The gate insulation layer 140 may be a single layer including tetraethyl orthosilicate (TEOS), a silicon oxide (SiOx), and a silicon nitride (SiNx), or a multilayer formed by stacking tetraethyl orthosilicate (TEOS), a silicon oxide (SiOx), and a silicon nitride (SiNx).

A first gate electrode 155 may be disposed on the gate insulation layer 140. The first gate electrode 155 may overlap the first channel region 1355.

The first gate electrode 155 may be formed of a single layer or a multilayer including a low resistance material or a corrosion resistant material such as aluminum (Al), titanium (Ti), molybdenum (Mo), copper (Cu), nickel (Ni), or alloys thereof, or a material having low resistance to corrosion.

A first interlayer insulation layer 160 may be disposed on the first gate electrode 155. The first interlayer insulation layer 160 may be formed of a single layer of tetraethyl orthosilicate (TEOS), a silicon nitride, or a silicon oxide, or a multilayer formed by stacking tetraethyl orthosilicate (TEOS), a silicon nitride, and a silicon oxide.

The first interlayer insulation layer 160 and the gate insulation layer 140 may have a first source contact hole 166 and a first drain contact hole 167 that respectively overlap the first source region 1356 and the first drain region 1357.

A first source electrode 173 and a first drain electrode 175 may be disposed on the first interlayer insulation layer 160.

The first source electrode 173 and the first drain electrode 175 may be respectively connected with the first source region 1356 and the first drain region 1357 of the first semiconductor layer 135 through the first source contact hole 166 and the first drain contact hole 167.

The first source electrode 173 and the first drain electrode 175 may be formed of a single layer or a plurality of layers including a low resistance material or a corrosion resistant material such as aluminum (Al), titanium (Ti), molybdenum (Mo), copper (Cu), nickel (Ni), or an alloy thereof.

The first semiconductor layer 135, the first gate electrode 155, the first source electrode 173, and the first drain electrode 175 may form a driving thin film transistor.

A second interlayer insulation layer 180 may be disposed on the first source electrode 173 and the first drain electrode 175. Similar to the first interlayer insulation layer 160, the second interlayer insulation layer 180 may be formed of a single layer of tetraethyl orthosilicate (TEOS), a silicon nitride, or a silicon oxide, or a multilayer formed by stacking tetraethyl orthosilicate (TEOS), a silicon nitride, and a silicon oxide.

The second interlayer insulation layer 180 includes a contact hole 82 that overlaps the first drain electrode 175. A pixel electrode 191 may be disposed on the second interlayer insulation layer 180. The pixel electrode 191 may be connected with the first drain electrode 175 through the contact hole 82. The pixel electrode 191 may be an anode of an organic light emitting element.

A barrier rib 190 may be disposed on the pixel electrode 191. The barrier rib 190 may include an opening 197 that overlaps the pixel electrode 191.

A part of the barrier rib 190 may protrude upward, thereby forming a barrier rib spacer 420. The barrier rib 190 may include a first layer 410 and a second layer 420, and may include a barrier layer 430 disposed between the first layer 410 and the second layer 420. The barrier layer 430 may include at least one of SiNx, SiOx, SiON, Mo, a Mo oxide, Cu, a Cu oxide, Al, an Al oxide, Ag, and a Ag oxide or other suitable materials. The barrier layer 430 may have a thickness in a range of about 20 Å to about 1000 Å.

The area of the second layer 420 of the barrier rib 190 may be smaller than that of the first layer 410 of the barrier rib 190. The second layer 420 may form a barrier rib spacer by protruding from the first layer 410. The pattern of the photoresist 400, shown in FIG. 4 may be used as the barrier rib 190 and the barrier rib spacer of the display device.

An emission layer 360 may be disposed in the opening 197 of the barrier rib 190.

The emission layer 360 may be a plurality of layers including at least one of an emission layer, a hole injection layer (HIL), a hole transport layer (HTL), an electron transport layer (ETL), and an electron injection layer (EIL). When the emission layer 360 includes all of the above-stated layers, the hole injection layer may be disposed on the pixel electrode 191, which may be an anode, and the hole transport layer, the emission layer, the electron transport layer, and the electron injection layer may be sequentially stacked thereon.

The emission layer 360 may include an organic material or an inorganic material. For example, the emission layer 360 may include quantum dots. The quantum dots may be selected from a group II-VI compound, a group III-V compound, a group IV-VI compound, a group IV element, a group IV compound, and a combination thereof.

The group II-VI compound may be selected from: a group of two-element compounds selected from CdSe, CdTe, ZnS, ZnSe, ZnTe, ZnO, HgS, HgSe, HgTe, MgSe, MgS, and a mixture thereof; a group of three-element compounds selected from: CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a group of four-element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group III-V compound may be selected from: a group of two-elements compounds selected from GaN, GaP, GaAs, GaSb, AlN, AlP, AlAs, AlSb, InN, InP, InAs, InSb, and a mixture thereof; a group of three-element compounds selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a group of four-element compounds selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The group IV-VI compound may be selected from: a group of two-elements compound selected from SnS, SnSe, SnTe, PbS, PbSe, PbTe, and a mixture thereof; a group of three-elements compounds selected from SnSeS, SnSeTe, SnالسTe, PbSeS, PbSeTe, PbSTe, SnPbS, SnPbSe, SnPbTe, and a mixture thereof; and a group of four-elements compounds selected from SnPbSSe, SnPbSeTe, SnPbSTe, and a mixture thereof. The group IV element may be selected from a group of Si, Ge, and a mixture thereof. The group IV compound may be a two-element compound selected from a group of SiC, SiGe, and a mixture thereof.

The two-element compound, the three-element compound, and the four-element compound may be present in a particle in uniform concentrations or may have partially different concentrations in the same particle, respectively. A core/shell structure in which one quantum dot encloses the other quantum dot may be possible. An interfacing surface between the core and the shell may have a concentration gradient in which a concentration of an element decreases closer to its center.

A form of the quantum dot is a form generally used in the art but is not particularly limited. For example, it is preferable to use forms such as spherical, pyramidal, multi-arm-shaped, or cubic nanoparticles, nanotubes, nanowires, nanofibers, and nanoplate-shaped particles.

A common electrode 270 may be disposed on the barrier rib 190 and the emission layer 360. The common electrode 270 may be a cathode of the organic light emitting element. Thus, the pixel electrode 191, the emission layer 360, and the common electrode 270 form an organic light emitting element 70.

Figure 14:
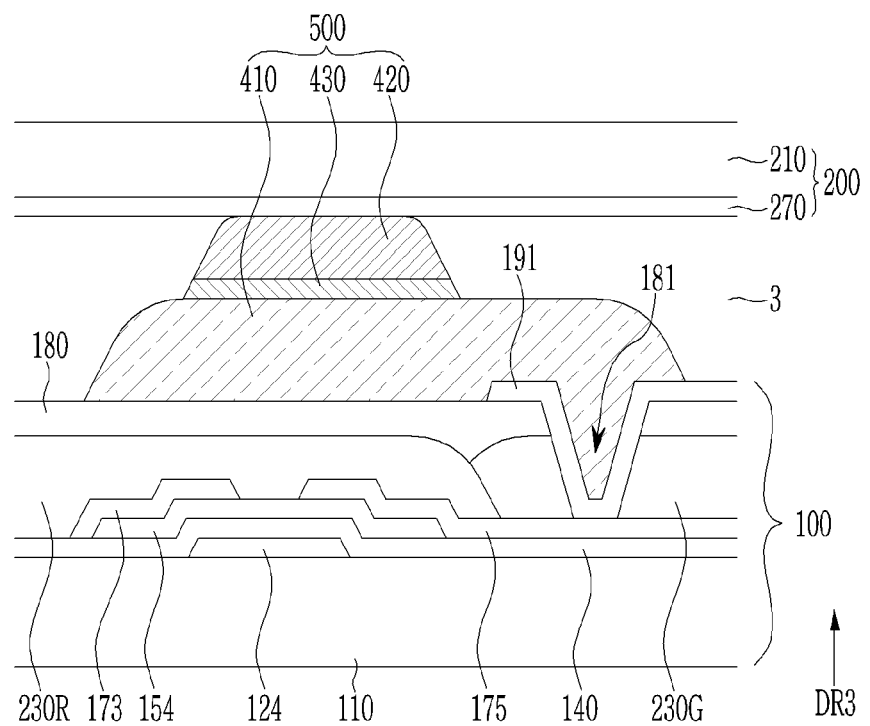
FIG. 14 shows a liquid crystal display according to another exemplary embodiment of the invention.

Referring to FIG. 14, a liquid crystal display according to another exemplary embodiment of the invention will be described.

Referring to FIG. 14, a display device according to the exemplary embodiment includes a first display panel 100, a second display panel 200, and a liquid crystal layer 3 disposed between the first display panel 100 and the second display panel 200.

The first display panel 100 will be described. A plurality of gate lines (not shown) may be disposed on the substrate 110. Substrate 110 may be an insulation substrate. A part of the gate line may protrude and thus forms a gate electrode 124.

A gate insulation layer 140 formed of an insulation material such as a silicon oxide or a silicon nitride may be disposed on the gate electrode 124. The gate insulation layer 140 may have a multilayer structure including at least two insulation layers, each having a different physical property.

A plurality of semiconductor layers 154 may be disposed on the gate insulation layer 140. The semiconductor layer 154 may be disposed while overlapping the gate electrode 124.

Next, a plurality of data lines (not shown), a plurality of source electrodes 173, and a plurality of data electrodes 175 connected with the data lines (not shown) may be disposed on the semiconductor layer 154 and the gate insulation layer 140. The drain electrode 175 is separated from the source electrode 173.

Next, a plurality of color filters 230 may be disposed on the source electrode 173 and the drain electrode 175. The color filters may include a red color filter 230R, a green color filter 230G, and a blue color filter (not shown).

An insulation layer 180 is disposed. The insulation layer 180 may be formed of an inorganic insulating material such as a silicon nitride or a silicon oxide, an organic insulating material, and a low-dielectric insulating material.

The insulation layer 180 and the color filter 230 may include a contact hole 181 that overlaps the drain electrode 175. The pixel electrode 191 is physically and electrically connected with the drain electrode 175 through the contact hole 181 and receives a data voltage from the drain electrode 175.

The second display panel 200 will be described. The common electrode 270 may be disposed on a second substrate 210. The second substrate 210 may be an insulation substrate. The common electrode 270 receives a common voltage and aligns liquid crystal molecules of the liquid crystal layer 3, together with the pixel electrode 191.

A light blocking spacer 500 may be disposed between the first display panel 100 and the second display panel 200. The light blocking spacer 500 may include first layer 410 and a second layer 420, and a barrier layer 430 may be disposed between the first layer 410 and the second layer 420. The barrier layer 430 may include one or more of SiNx, SiOx, SiON, Mo, a Mo oxide, Cu, a Cu oxide, Al, an Al oxide, Ag, and a Ag oxide or other suitable material. The barrier layer 430 may have a thickness in a range of about 20 Å to about 1000 Å.

The first layer 410 and the second layer 420 may include a material that does not transmit light. Thus, the light blocking spacer 500 may function as a light blocking member. By way of example, the area of the second layer 420 may be smaller than that of the first layer 410, and the second layer 420 may protrude from the first layer 410. The second layer 420 may function as a spacer and maintains a cell gap between the first display panel 100 and the second display panel 200.

The light blocking spacer 500 in the liquid crystal display may be the photoresist pattern 400 shown in FIG. 4. For example, the photoresist pattern 400 shown in FIG. 4 may be used as the light blocking spacer 500 of the liquid crystal display.

While the invention has been illustrated and described with reference to the embodiments thereof, it will be apparent to those of ordinary skill in the art that various changes in form and detail may be formed thereto without departing from the spirit and scope of the invention.

What is claimed is:

1. A multilayer photoresist comprising:
a first layer made of a first photoresist material;
a second layer made of a second photoresist material; and
a transparent barrier layer disposed between the first layer and the second layer and in direct contact with both the first layer and the second layer, wherein
the transparent barrier layer comprises a Mo oxide,
the transparent barrier layer is thinner than the first layer and the second layer, and
the transparent barrier layer is not in contact with the substrate.

2. The multilayer structure of claim 1, wherein the first layer and the second layer comprise a same material.

3. The multilayer photoresist of claim 2, wherein the first layer and the second layer have different etching rates.

4. The multilayer photoresist of claim 1, wherein the first layer and the second layer comprise different materials.

5. The multilayer photoresist of claim 4, wherein the first layer and the second layer have different etching rates.

6. The multilayer photoresist of claim 1, wherein the transparent barrier layer has a thickness of in a range of about 20 Å to about 1000 Å.

7. The multilayer photoresist of claim 1, wherein an etching rate of the transparent barrier layer is between an etching rate of the first layer and an etching rate of the second layer.

8. The multilayer photoresist of claim 1, wherein
an etching rate of the first layer is greater than that of the transparent barrier layer, and
an etching rate of the transparent barrier layer is greater than that of the second layer.

9. The multilayer photoresist of claim 1, wherein an etching rate of the second layer is greater than that of the transparent barrier layer, and the etching rate of the transparent barrier layer is greater than that of the first layer.

10. A method for manufacturing a multilayer photoresist, comprising:
applying a first layer of a photoresist, the first layer being made of a first photoresist material;
forming a transparent barrier layer on the first layer;
applying a second layer of the photoresist on the transparent barrier layer, the second layer being made of a second photoresist material;
after applying the second layer, applying a mask and exposing the photoresist to light; and
simultaneously etching the first layer and the second layer of the exposed photoresist, wherein
the first layer, the transparent barrier layer, and the second layer have different etching rates, and
the forming of the transparent barrier layer comprises forming the transparent barrier layer of a Mo oxide.

11. The method for manufacturing a multilayer photoresist of claim 10, wherein an etching rate of the first layer is greater than that of the transparent barrier layer, and the etching rate of the transparent barrier layer is greater than that of the second layer.

12. The method for manufacturing a multilayer photoresist of claim 10, wherein the first layer and the second layer comprise the same material.

13. The method for manufacturing a multilayer photoresist of claim 12, wherein the first layer and the second layer comprise the same material and have different etching rates.

14. The method for manufacturing a multilayer photoresist of claim 10, wherein the first layer and the second layer comprise different materials.

15. The method for manufacturing a multilayer photoresist of claim 10, wherein the transparent barrier layer has a thickness of in a range of about 20 Å to about 1000 Å.

16. The method for manufacturing a multilayer photoresist of claim 10, wherein the etching rate of the transparent barrier layer is between the etching rate of the first layer and the etching rate of the second layer.

17. The method for manufacturing a multilayer photoresist of claim 10, wherein an etching rate of the second layer is greater than that of the transparent barrier layer, and the etching rate of the transparent barrier layer is greater than that of the first layer.

18. The method for manufacturing a multilayer photoresist of claim 17, wherein in simultaneous etching of the first layer and the second layer of the exposed portion of the photoresist, an area of the first layer is greater than that of the second layer of a formed photoresist pattern.

19. The method for manufacturing a multilayer photoresist of claim 10, wherein the etching rate of the first layer is greater than that of the transparent barrier layer, and the etching rate of the transparent barrier layer is greater than that of the second layer.

20. The method for manufacturing a multilayer photoresist of claim 19, wherein, in the simultaneous etching of the first layer and the second layer of the exposed photoresist, an area of the first layer is smaller than that of the second layer of a formed photoresist pattern.

21. The method for manufacturing a multilayer photoresist of claim 20, wherein a size of the area of the transparent barrier layer is between the area of the first layer and an area of the second layer.

22. The method for manufacturing a multilayer photoresist of claim 20, wherein the etching rates of the first layer, the transparent barrier layer, and the second layer determine a shape of the formed photoresist pattern.

23. The method for manufacturing a multilayer photoresist of claim 22, wherein the formed photoresist pattern is used to form a semiconductor layer, source and drain electrodes, an emission layer, or a support that locates a mask.

24. The method for manufacturing a multilayer photoresist of claim 10 wherein the mask is a half-tone mask.

25. A display device comprising:
a first substrate;
a transistor disposed on the first substrate;
a pixel electrode connected with the transistor; and
a photoresist disposed on the pixel electrode, wherein
the photoresist comprises:
a first layer and a second layer, and
a barrier layer disposed between the first layer and the second layer, and an area of the second layer is different from that of the first layer.

26. The display device of claim 25, wherein the photoresist is a spacer.

27. The display device of claim 25, wherein the area of the second layer is smaller than that of the first layer.

28. The display device of claim 26, wherein the spacer is a barrier rib spacer in which a second layer protrudes from a first layer of a barrier rib.

29. The display device of claim 28, wherein the barrier rib includes an opening disposed over the pixel electrode and an emission layer is disposed in the opening of the barrier rib.

30. The display device of claim 25, further comprising:
a second substrate disposed over the first substrate; and
a liquid crystal layer disposed between the first substrate and the second substrate, wherein
the spacer is disposed between the first substrate and the second substrate, and
the first layer and the second layer of the spacer comprise a light blocking material.

31. The display device of claim 25, wherein the barrier layer comprises a Mo oxide, and the barrier layer has a thickness in a range of about 20 Å to about 1000 Å.

* * * * *